(12) United States Patent
Chang et al.

(10) Patent No.: US 10,394,719 B2
(45) Date of Patent: Aug. 27, 2019

(54) REFRESH AWARE REPLACEMENT POLICY FOR VOLATILE MEMORY CACHE

(71) Applicant: Samsung Electronics Co., Ltd., Suwon-si, Gyeonggi-do (KR)

(72) Inventors: Mu-Tien Chang, Santa Clara, CA (US); Dimin Niu, Sunnyvale, CA (US); Hongzhong Zheng, Los Gatos, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 144 days.

(21) Appl. No.: 15/457,813

(22) Filed: Mar. 13, 2017

(65) Prior Publication Data
US 2018/0210843 A1    Jul. 26, 2018

Related U.S. Application Data

(60) Provisional application No. 62/450,505, filed on Jan. 25, 2017.

(51) Int. Cl.
G06F 12/126 (2016.01)
G06F 12/128 (2016.01)
G11C 11/406 (2006.01)

(52) U.S. Cl.
CPC .......... *G06F 12/128* (2013.01); *G06F 12/126* (2013.01); *G11C 11/40618* (2013.01); *G06F 2212/1021* (2013.01)

(58) Field of Classification Search
None
See application file for complete search history.

(56) References Cited

U.S. PATENT DOCUMENTS

| 5,172,341 A | 12/1992 | Amin |
| 5,802,560 A | 9/1998 | Joseph et al. |
| 6,028,804 A | 2/2000 | Leung |
| 6,496,437 B2 | 12/2002 | Leung |
| 6,625,077 B2 | 9/2003 | Chen |
| 6,757,784 B2 | 6/2004 | Lu et al. |
| 6,848,035 B2 | 1/2005 | Akiyama et al. |
| 7,284,095 B2 | 10/2007 | Hu et al. |
| 7,882,302 B2 | 2/2011 | Faucher et al. |
| 8,072,829 B2 | 12/2011 | Kim |

(Continued)

FOREIGN PATENT DOCUMENTS

CN    103811048 A    5/2014

OTHER PUBLICATIONS

Chaudhuri, Mainak et al., "Micro-sector Cache: Improving Space Utilization in Sectored DRAM Caches", Dec. 20, 2015, pp. 1-61.

*Primary Examiner* — Adam M Queler
*Assistant Examiner* — Edmund H Kwong
(74) *Attorney, Agent, or Firm* — Lewis Roca Rothgerber Christie LLP

(57) ABSTRACT

A method for replacing data on a volatile memory cache is provided. The volatile memory cache includes one or more memory banks and each of the memory banks includes a plurality of memory lines. The method includes: identifying a replacement ID for at least one of the memory lines to be replaced; identifying a refresh bank ID for one of the memory banks to be refreshed; determining whether or not a conflict exists between the replacement ID and the refresh bank ID; and selecting a new replacement ID if the conflict exists.

20 Claims, 11 Drawing Sheets

(56) References Cited

U.S. PATENT DOCUMENTS

| | | |
|---|---|---|
| 9,293,187 B2 | 3/2016 | Iyer et al. |
| 2008/0270683 A1 | 10/2008 | Barth et al. |
| 2011/0131371 A1* | 6/2011 | Sun ................. G11C 11/406 |
| | | 711/106 |
| 2011/0167192 A1* | 7/2011 | Iyer ................... G06F 12/06 |
| | | 711/5 |
| 2016/0188222 A1 | 6/2016 | Miller et al. |
| 2016/0188490 A1 | 6/2016 | Samih |
| 2017/0140810 A1* | 5/2017 | Choi ............. G11C 11/40603 |

* cited by examiner

REFRESH AWARE REPLACEMENT POLICY FOR VOLATILE MEMORY CACHE

CROSS-REFERENCE TO RELATED APPLICATION(S)

This application claims priority to and the benefit of U.S. Provisional Patent Application No. 62/450,505 filed Jan. 25, 2017, the entire content of which is incorporated herein by reference.

FIELD

One or more aspects of embodiments according to the present invention relate to volatile memory caches, and more particularly, to replacement policies for volatile memory caches.

BACKGROUND

Existing cache replacement policies generally have two primary design considerations, namely, achieving the best cache hit ratio and maintaining a reasonable implementation cost. These design considerations typically assume that an on-chip SRAM cache is being used. Because SRAM cache is non-volatile memory (NVM), refreshing is typically not used with SRAM cache. To reduce implementation cost and/or to reduce the chip size, there is a trend to utilize DRAM in on-chip cache. Because DRAM cache is volatile memory, refreshing is used with DRAM cache. Further, SRAM cache is typically faster than DRAM cache but DRAM cache is typically cheaper than SRAM cache and typically has a higher storage capacity per unit area than SRAM cache.

SUMMARY

Aspects of embodiments of the present disclosure are directed toward replacement policies for volatile memory caches that use refreshing. According to embodiments of the present invention, when a conflict exists between a replacement ID and a refresh bank ID, either the replacement ID or the refresh bank ID may be changed in order to avoid delays. More particularly, some embodiments of the present invention may identify a replacement ID and a refresh bank ID and when there is a conflict, embodiments of the present invention may select a new replacement ID in order to avoid delays caused by the conflict. Additionally, some embodiments of the present invention may identify a replacement ID and a refresh bank ID and when there is a conflict, embodiments of the present invention may check if the refresh bank ID can be changed and, if the refresh bank ID can be changed, select a new refresh bank ID in order to avoid delays caused by the conflict.

According to an embodiment of the present invention, there is provided a method of replacing data on a volatile memory cache, the volatile memory cache including one or more memory banks, each of the memory banks including a plurality of memory lines, the method including: identifying a replacement ID for at least one of the memory lines to be replaced; identifying a refresh bank ID for one of the memory banks to be refreshed; determining whether or not a conflict exists between the replacement ID and the refresh bank ID; and selecting a new replacement ID if the conflict exists.

The volatile memory cache may include a Dynamic Random-Access Memory (DRAM) cache.

The method may be performed by a cache manager of the volatile memory cache.

The cache manager may include: a replacement manager to identify the replacement ID; a refresh controller to identify the refresh bank ID; and a comparator to determine whether or not the conflict exists.

The replacement manager may further select the new replacement ID based on replacement feedback received from the comparator.

According to another embodiment of the present invention there is provided a method of replacing data on a volatile memory cache, the volatile memory cache including one or more memory banks, each of the memory banks including a plurality of memory lines, the method including: identifying a replacement ID for at least one of the memory lines to be replaced; identifying a first refresh bank ID for one of the memory banks to be refreshed; determining whether or not a conflict exists between the replacement ID and the first refresh bank ID; if the conflict exists, determining whether or not the first refresh bank ID can be changed; and if the conflict exists and the first refresh bank ID can be changed, selecting a second refresh bank ID.

The volatile memory cache may include a Dynamic Random-Access Memory (DRAM) cache.

The method may be performed by a cache manager of the volatile memory cache.

The cache manager may include: a replacement manager to identify the replacement ID; a refresh controller to identify the first refresh bank ID; and a comparator to determine whether or not the conflict exists.

The refresh controller may further select the second refresh bank ID based on refresh feedback received from the comparator.

The method may further include, if the conflict exists and the first refresh bank ID cannot be changed, selecting a new replacement ID.

The method may be performed by a cache manager of the volatile memory cache. The cache manager may include: a replacement manager to identify the replacement ID; a refresh controller to identify the first refresh bank ID; and a comparator to determine whether or not the conflict exists.

When the second refresh bank ID is selected, refreshing of the first refresh bank ID may be postponed until the next regularly scheduled refresh of the first refresh bank ID.

When the second refresh bank ID is selected, refreshing of the first refresh bank ID may be postponed until a time at which the second refresh bank ID would have been refreshed.

According to another embodiment of the present invention there is provided a cache manager for managing a cache including a volatile memory cache, the volatile memory cache including one or more memory banks, each of the memory banks including a plurality of memory lines, the cache manager including: a replacement manager to identify a replacement ID for at least one of the memory lines to be replaced; a refresh controller to identify a refresh bank ID for one of the memory banks to be refreshed; and a comparator to determine whether or not a conflict exists between the replacement ID and the refresh bank ID and, if the conflict exists, to send either replacement feedback to the replacement manager or refresh feedback to the refresh controller, the replacement feedback to cause the replacement manager to select a new replacement ID and the refresh feedback to cause the refresh controller to select a new refresh bank ID.

The volatile memory cache may include a Dynamic Random-Access Memory (DRAM) cache.

The comparator may further be configured to send the replacement feedback to the replacement manager.

The comparator may further be configured to send the refresh feedback to the refresh controller.

The comparator may further be configured to: if the conflict exists, determine whether or not the refresh bank ID can be changed; if the refresh bank ID can be changed, send the refresh feedback to the refresh controller; and if the refresh bank ID cannot be changed, send the replacement feedback to the replacement manager.

The cache may further include non-volatile memory.

BRIEF DESCRIPTION OF THE DRAWINGS

These and other features and aspects of the present invention will be appreciated and understood with reference to the specification, claims, and appended drawings wherein:

DETAILED DESCRIPTION

According to embodiments of the present invention, when a conflict exists between a replacement ID and a refresh bank ID, either the replacement ID or the refresh bank ID may be changed in order to avoid delays. More particularly, some embodiments of the present invention may identify a replacement ID and a refresh bank ID and when there is a conflict, embodiments of the present invention may select a new replacement ID in order to avoid delays caused by the conflict. Additionally, some embodiments of the present invention may identify a replacement ID and a refresh bank ID and when there is a conflict, embodiments of the present invention may check if the refresh bank ID can be changed and, if the refresh bank ID can be changed, select a new refresh bank ID in order to avoid delays caused by the conflict.

The detailed description set forth below in connection with the appended drawings is intended as a description of exemplary embodiments of refresh aware replacement policies for volatile memory caches provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

The entire contents of U.S. patent application Ser. No. 15/349,949 filed Nov. 11, 2016 and entitled Byte-Addressable Flash-Based Module, U.S. patent application Ser. No. 15/272,339 filed Sep. 21, 2016 and entitled HBM with In-Memory Cache, and U.S. patent application Ser. No. 15/285,423 filed Oct. 4, 2016 and entitled System and Method for operating a DDR-Compatible Asynchronous Memory module are incorporated herein by reference in their entirety.

High bandwidth memory (HBM) is a high-performance three dimensional (3D)-stacked dynamic random access memory (DRAM). Second generation High Bandwidth Memory may include up to 8 dies per stack and provide pin transfer rates of up to 2 GT/s (giga transfers per second). The interface may include 8 channels, each 128 bits wide, for a total of 1024-bit wide access. Second generation High Bandwidth Memory may be able to reach 256 GB/s memory bandwidth per package, and may have a storage capacity of up to 8 GB per package. The interface of a second generation High Bandwidth Memory may comply with a standard accepted by the Joint Electron Device Engineering Council (JEDEC).

Figure 1:
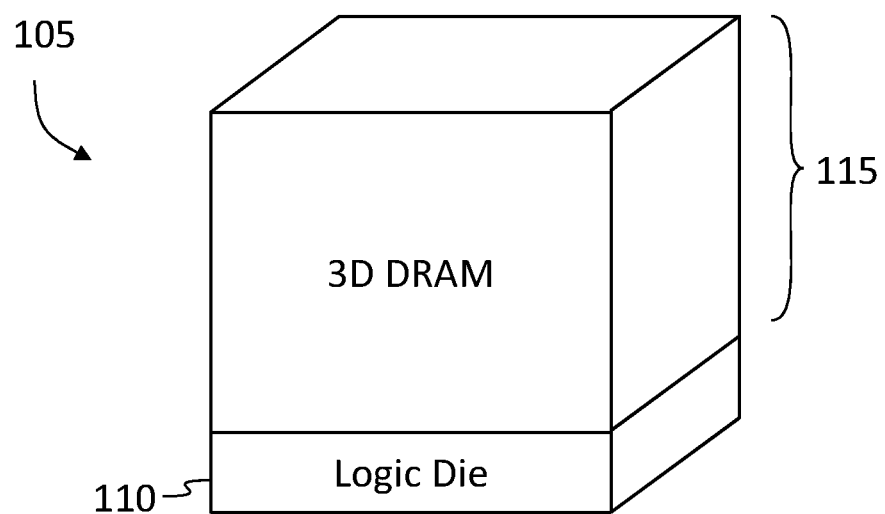
FIG. 1 is a schematic perspective view of a high bandwidth memory stack, according to an embodiment of the present invention.

FIG. 1 is a perspective view of a high bandwidth memory stack, according to an embodiment of the present invention. Referring to FIG. 1, the physical configuration of an HBM stack 105 may include a logic die 110, and a three dimensional DRAM or "DRAM stack" 115, including a plurality of DRAM dies (e.g., 8 such dies) stacked on top of the logic die 110. Interconnections are formed within the stack with through-silicon vias (TSVs). Other HBM stacks may include, in the logic die, connections and signal conditioning circuitry, as a result of which the DRAM channel interfaces may be presented, substantially unchanged, to the host processor at the external interface of the HBM.

Figure 2:
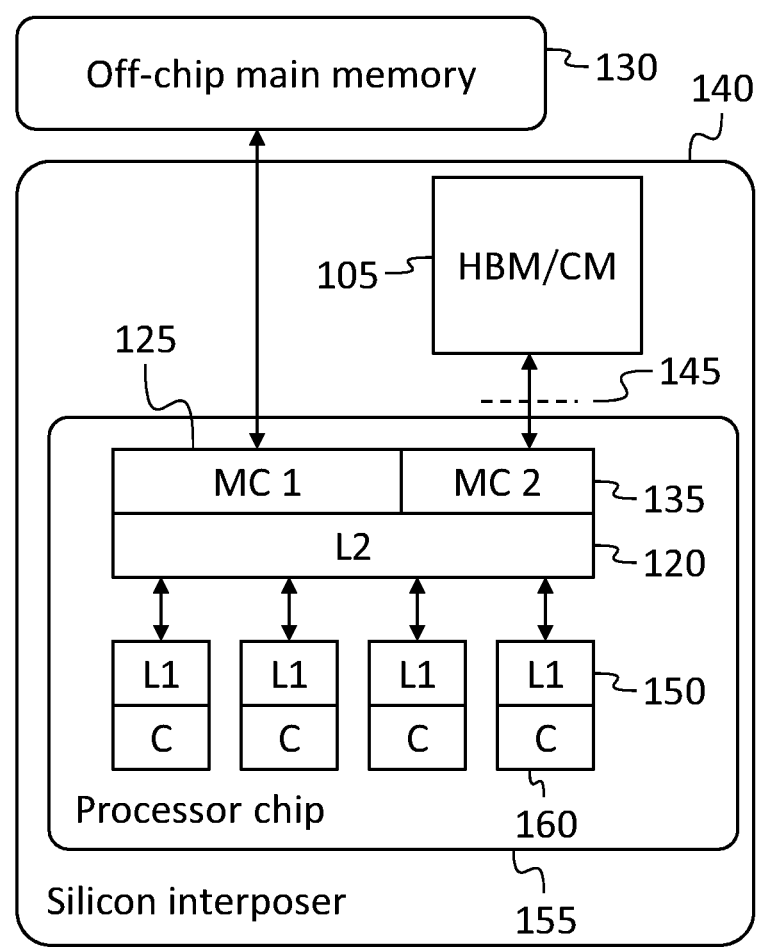
FIG. 2 is a block diagram of a processing system employing a high bandwidth memory stack as a level 3 cache, according to an embodiment of the present invention.

FIG. 2 is a block diagram of a processing system employing a high bandwidth memory stack as a level 3 cache, according to an embodiment of the present invention.

Referring to FIG. 2, an HBM stack 105 may be connected to a host processor 155 (e.g., a CPU or a GPU). The host processor 155 may include a plurality of cores (C) 160, each having a respective level 1 (L1) cache 150. Level 2 (L2) cache 120 may be connected to the level 1 (L1) caches 150, and a first memory controller (MC 1) 125 may provide an interface to the off-chip main memory 130. A second memory controller (MC 2) 135 may provide an interface to the HBM stack 105. The HBM stack 105 may include a cache manager (CM) in the logic die of the HBM stack 105. The HBM stack 105, with its integrated cache manager, may be employed by the host processor 155 as a level 3 cache (or, for example, as a level 4 cache in a system also having a level 3 cache). The HBM interface 145 may be a JEDEC compliant interface, i.e., it may provide conductors and signaling protocols specified by the JEDEC standard.

Figure 3:
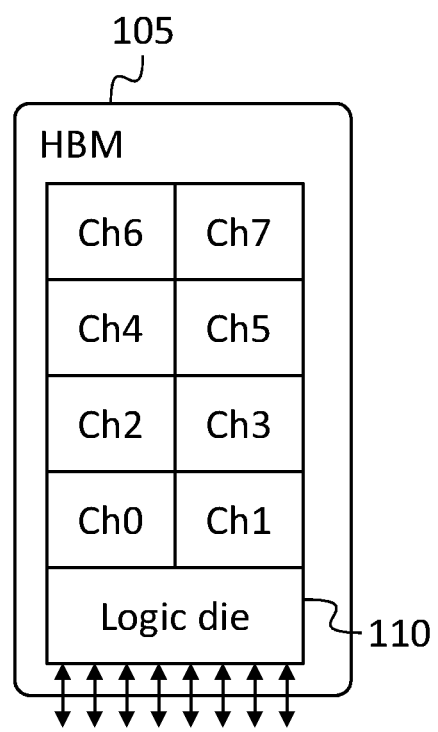
FIG. 3 is a block diagram of a high bandwidth memory stack, according to an embodiment of the present invention.

FIG. 3 is a block diagram of a high bandwidth memory (HBM) stack, according to an embodiment of the present invention. Referring to FIG. 3, in some embodiments, the HBM stack 105 may include the logic die 110, which may be connected to the DRAM, in the DRAM stack 115 (see FIG. 1, for example), through eight internal interfaces referred to as channels, and shown in FIG. 3 as Ch0-Ch7. Each level may be referred to as a die. For example, Ch0 and Ch1 may be at DRAM Die 0, Ch2 and Ch3 may be at DRAM Die 1, Ch4 and Ch5 may be at DRAM Die 2, and Ch6 and Ch7 may be at DRAM Die 3.

And beneath all the DRAM dies, there is a logic die where logic can be added. The logic die may communicate with the second memory controller 135 (see FIG. 2, for example). An interface between the logic die and the second memory controller 135 may be defined by the JEDEC standard.

According to embodiments of the present invention, some cache management logic may be added on the logic die so that the HBM as a whole itself can be treated as a self-managed cache. In those embodiments, the host processor 155 may not need to do additional work to control the cache.

Figure 4:
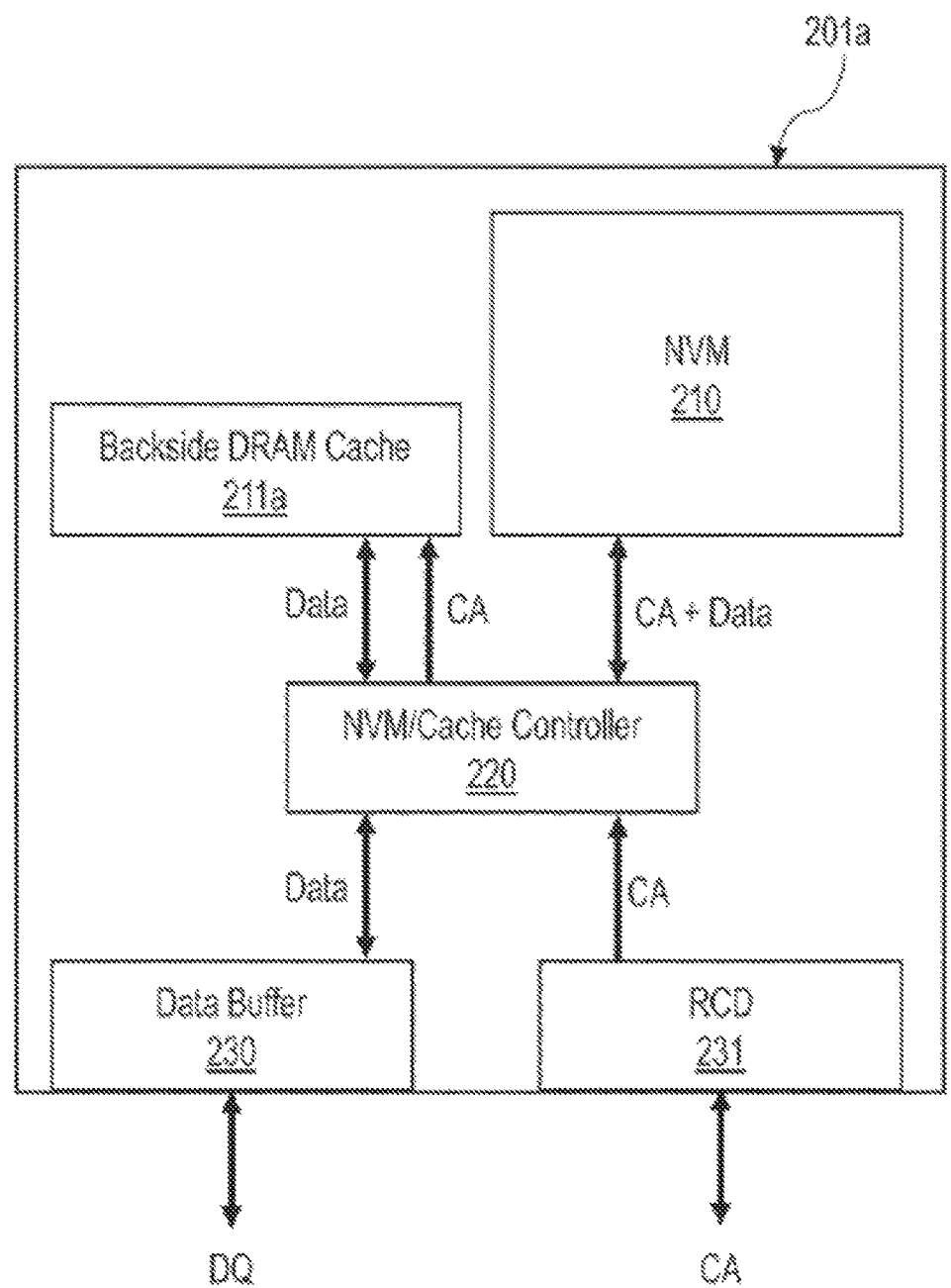
FIG. 4 shows an example of a Non-Volatile Dual In-Line Memory Module (NVDIMM) including a backside DRAM cache, according to one embodiment.

FIG. 4 shows an example of an NVDIMM including a backside DRAM cache, according to one embodiment. Referring to FIG. 4, NVDIMM 201a includes a non-volatile memory (NVM) 210, a backside DRAM cache 211a, and a NVM/cache controller 220. A data buffer 230 of the NVDIMM 201a provides data that is requested by a host memory controller of a status of the NVDIMM 201a via a data (DQ) bus. A registering clock driver (RCD) 231 of the NVDIMM 201a provides a control and address (CA) buffer that generates command sequences to the data buffer 230. The backside DRAM cache 211a is coupled to the NVM/cache controller 220 and can receive data from the data buffer 230 and control and address from the RCD 231 via the NVM/cache controller 220. This prohibits a direct access to the backside DRAM cache 211a by the host memory controller. The host memory controller can access the backside DRAM cache 211a in the direct mode but cannot directly access the backside DRAM cache 211a in the cache mode. The access to the backside DRAM cache 211a may require handshaking between the memory controller and the memory module, resulting in a longer access time than a conventional access time to a DRAM.

When using DRAM as a cache (for example 8 GB HBM), the impact of refreshing may be non-negligible. This means that, if a cache line is selected to be evicted or inserted, and the selected cache line is also in a bank that is just starting to be refreshed, a delay may be required before the selected cache line can be evicted or inserted. This wait may result in higher queuing delays for subsequent operations.

Refresh aware cache replacement policies according to embodiments of the present invention may be built on top of existing replacement policies. For example, existing replacement policies may be modified to incorporate embodiments of the present invention therein. Embodiments of the present invention may be built upon any of an LRU-based (a Least-Recently-Used-based) replacement policy, a random replacement policy, a FIFO (First-In-First-Out) replacement policy, an nMRU (not-Most-Recently-Used) replacement policy, and/or the like.

Typical replacement policies check a replacement ID. A refresh aware cache replacement policy according to embodiments of the present invention checks both the replacement ID and a refresh bank ID. Based on the replacement ID and the refresh bank ID, embodiments of the present invention may decide on a better line to replace or a better bank to refresh.

According to some embodiments of the present invention, if the replacement ID conflicts with the refresh bank ID, it means that the line to be replaced would be affected by refresh, then the next best replacement ID will be selected.

According to some other embodiments of the present invention, if replacement ID conflicts with refresh bank ID, then the next refresh bank to refresh will be selected. The bank that is postponed may be refreshed at the time that the next refresh bank would originally have been refreshed or may be delayed until its next regularly scheduled refresh.

Figure 5:
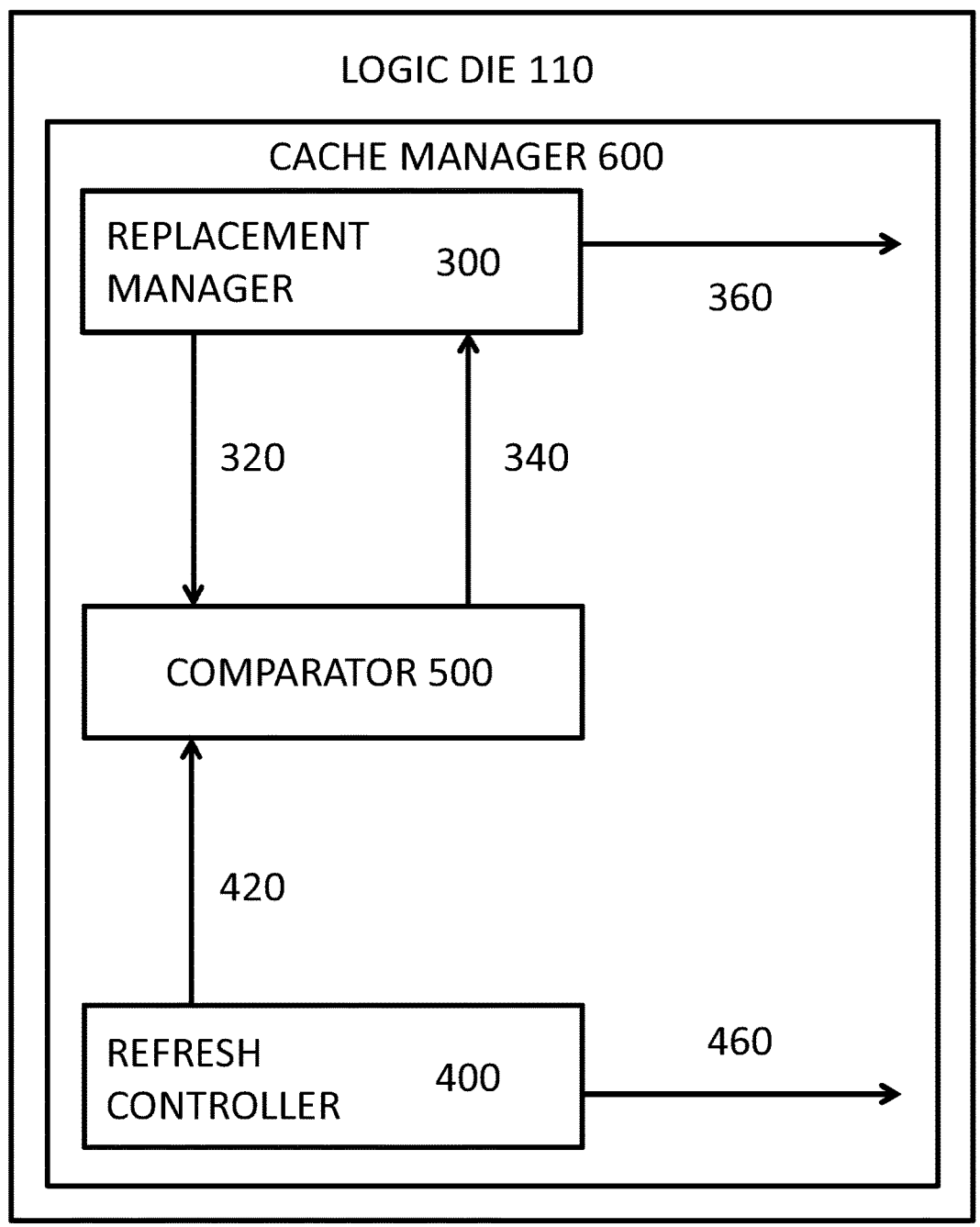
FIG. 5 is a block diagram of a logic die according to an embodiment of the present invention.

FIG. 5 is a block diagram of a logic die according to an embodiment of the present invention. Referring to FIG. 5, the logic die 110 (see FIGS. 1-3, for example) includes a cache manager 600. The cache manager 600 may manage a volatile memory cache. The cache manager 600 includes a replacement manager 300, a refresh controller 400, and a comparator 500. The volatile memory cache may be a 3D DRAM cache (for example, see the DRAM stack 115 of FIG. 1). The volatile memory cache may include one or more memory banks and each of the memory banks may include a plurality of memory lines.

The replacement manager 300 determines (or identifies) a replacement ID 320 based on a replacement policy. The replacement manager 300 provides the replacement ID 320 to the comparator 500.

The refresh controller 400 determines whether or not a refresh of any of the banks is needed. When a refresh is needed, the refresh controller 400 determines (or identifies) a refresh bank ID 420 based on a refresh policy. The refresh controller 400 provides the refresh bank ID 420 to the comparator 500. Further, the refresh controller 400 outputs the refresh bank ID 420 as a final refresh bank ID 460.

When a refresh is not needed, the refresh controller 400 may send a signal to the comparator 500 indicating that no refresh is needed rather than sending the refresh bank ID 420, but the present invention is not limited thereto. For example, when a refresh is not needed, the refresh controller 400 may send nothing to the comparator 500.

The comparator 500 compares the replacement ID 320 and the refresh bank ID 420. The comparator 500 determines whether or not there is a conflict between the replacement ID 320 and the refresh bank ID 420. The comparator 500 provides replacement feedback 340 to the replacement manager 302 indicating whether or not a conflict exists. According to one embodiment, the replacement feedback 340 is only provided by the comparator 500 when a conflict exists, and is not provided otherwise, but the present invention is not limited thereto. For example, the comparator 500 may provide the replacement feedback 340 at a first level if a conflict does not exist and at a second level if a conflict does exist.

When the replacement manager 300 receives the replacement feedback 340 indicating that the conflict does not exist (or the replacement manager 300 does not receive the replacement feedback 340), the replacement manager 300 outputs the replacement ID 320 as a final replacement ID 360.

When the replacement manager 300 receives the replacement feedback 340 indicating that the conflict exists, the replacement manager 300 selects the next replacement ID based on the replacement policy and outputs the next replacement ID as the final replacement ID 360. The next replacement ID may be the next best replacement ID, the next oldest replacement ID, etc.

In other word, the replacement manager 300 selects the new replacement ID based on the replacement feedback 340 received from the comparator 500.

Figure 6:
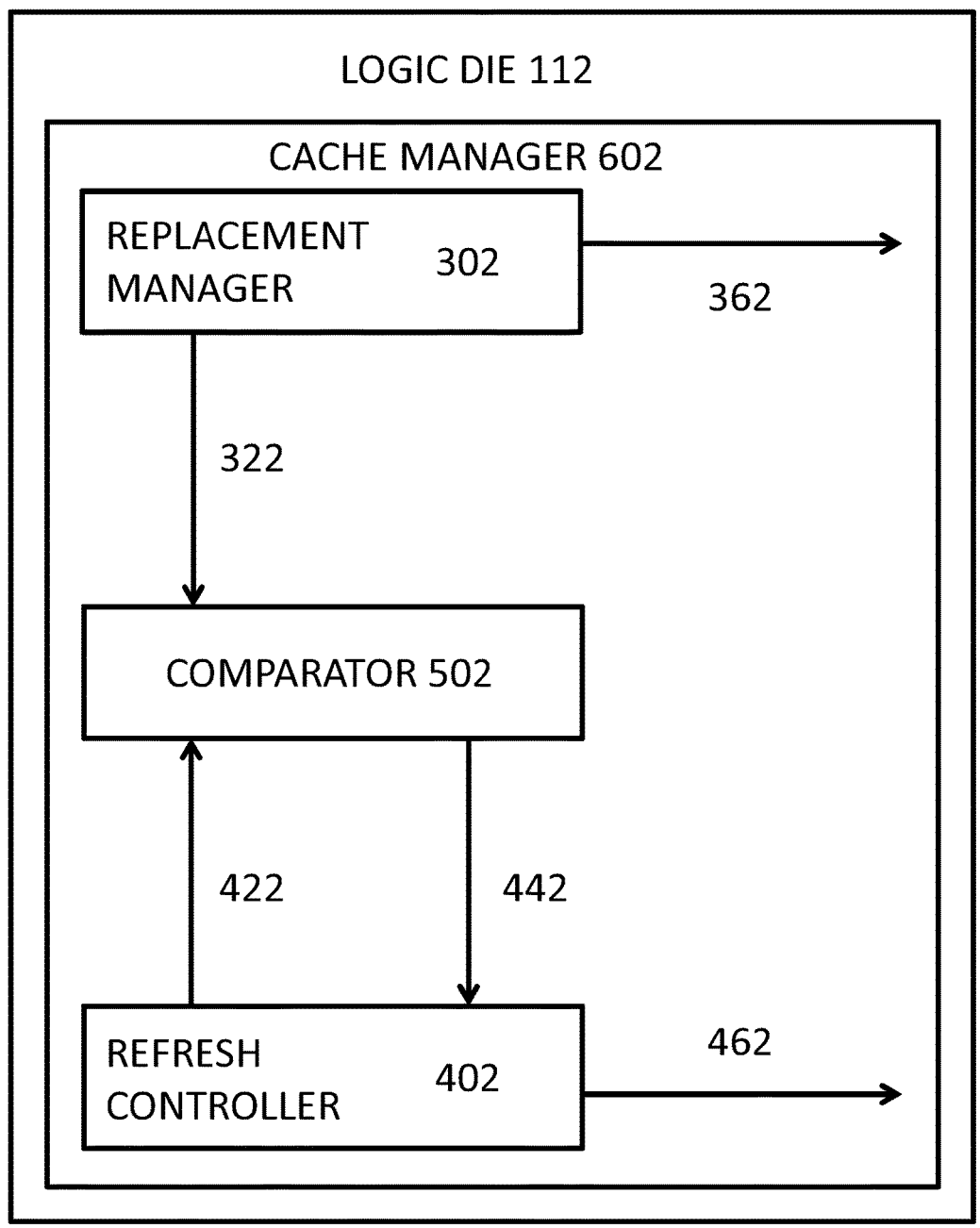
FIG. 6 is a block diagram of a logic die according to another embodiment of the present invention.

FIG. 6 is a block diagram of a logic die according to another embodiment of the present invention. Referring to FIG. 6, the logic die 112 includes a cache manager 602. The cache manager 602 may manage a volatile memory cache.

The cache manager 602 includes a replacement manager 302, a refresh controller 402, and a comparator 502. The volatile memory cache may be a 3D DRAM cache (for example, see the DRAM stack 115 of FIG. 1). The volatile memory cache may include one or more memory banks and each of the memory banks may include a plurality of memory lines.

The replacement manager 302 determines (or identifies) a replacement ID 322 based on a replacement policy. The replacement manager 302 provides the replacement ID 322 to the comparator 502. Further, the replacement manager 302 outputs the replacement ID 322 as a final replacement ID 362.

The refresh controller 402 determines whether or not a refresh of any of the banks is needed. When a refresh is needed, the refresh controller 402 determines (or identifies) a refresh bank ID 422 based on a refresh policy. The refresh controller 402 provides the refresh bank ID 422 to the comparator 502.

When a refresh is not needed, the refresh controller 402 may send a signal to the comparator 502 indicating that no refresh is needed rather than sending the refresh bank ID 422, but the present invention is not limited thereto. For example, when a refresh is not needed, the refresh controller 402 may send nothing to the comparator 502.

The comparator 502 compares the replacement ID 322 and the refresh bank ID 422. The comparator 502 determines whether or not there is a conflict between the replacement ID 322 and the refresh bank ID 422. The comparator 502 provides refresh feedback 442 to the refresh controller 402 indicating whether or not a conflict exists. According to one embodiment, the refresh feedback 442 is only provided by the comparator 502 when a conflict exists, and is not provided otherwise, but the present invention is not limited thereto. For example, the comparator 502 may provide the refresh feedback 442 at a first level if a conflict does not exist and at a second level if a conflict does exist.

When the refresh controller 402 receives the refresh feedback 442 indicating that the conflict does not exist (or the refresh controller 402 does not receive the refresh feedback 442), the refresh controller 402 outputs the refresh bank ID 422 as a final refresh bank ID 462.

When the refresh controller 402 receives the refresh feedback 442 indicating that the conflict exists, the refresh controller 402 determines whether or not the refresh bank ID 422 can be postponed (or changed) and if the refresh bank ID 422 can be postponed (or changed), selects the next refresh bank ID based on the refresh policy and outputs the next refresh bank ID as the final refresh bank ID 462. The next refresh bank ID may be the next best refresh bank ID, the next oldest refresh bank ID, etc.

In other word, the refresh controller 402 selects the next refresh bank ID based on the refresh feedback 442 received from the comparator 502.

The bank that is postponed may be refreshed at the time that the next refresh bank would originally have been refreshed or may be delayed until its next regularly scheduled refresh.

Figure 7:
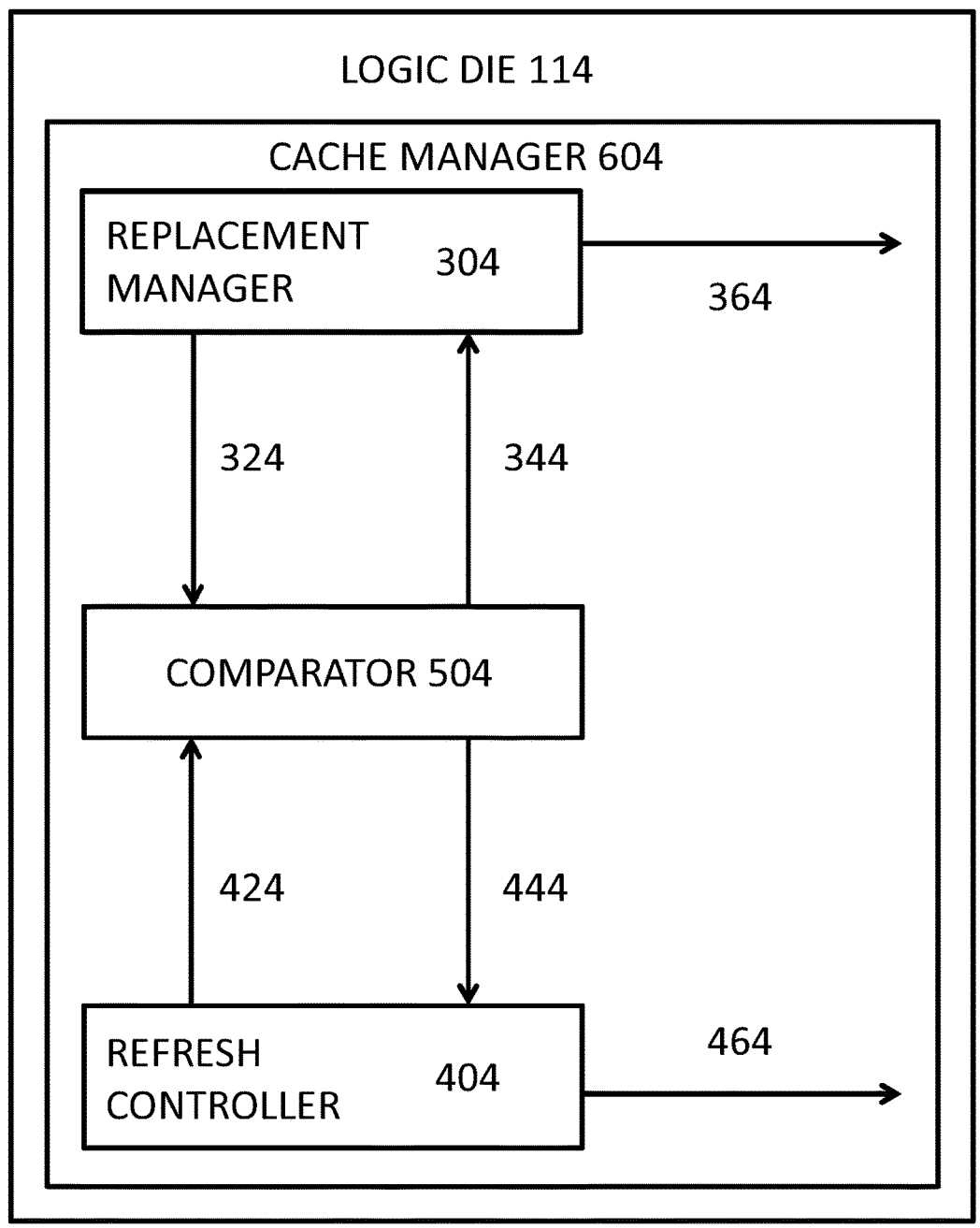
FIG. 7 is a block diagram of a logic die according to another embodiment of the present invention.

FIG. 7 is a block diagram of a logic die according to another embodiment of the present invention. Referring to FIG. 7, the logic die 114 includes a cache manager 604. The cache manager 604 may manage a volatile memory cache. The cache manager 604 includes a replacement manager 304, a refresh controller 404, and a comparator 504. The volatile memory cache may be a 3D DRAM cache (for example, see the DRAM stack 115 of FIG. 1). The volatile memory cache may include one or more memory banks and each of the memory banks may include a plurality of memory lines.

The replacement manager 304 determines (or identifies) a replacement ID 324 based on a replacement policy. The replacement manager 304 provides the replacement ID 324 to the comparator 504.

The refresh controller 404 determines whether or not a refresh of any of the banks is needed. When a refresh is needed, the refresh controller 404 determines (or identifies) a refresh bank ID 424 based on a refresh policy. The refresh controller 404 provides the refresh bank ID 424 to the comparator 504.

When a refresh is not needed, the refresh controller 404 may send a signal to the comparator 504 indicating that no refresh is needed rather than sending the refresh bank ID 424, but the present invention is not limited thereto. For example, when a refresh is not needed, the refresh controller 404 may send nothing to the comparator 504.

The comparator 504 compares the replacement ID 324 with the refresh bank ID 424. The comparator 504 determines whether or not there is a conflict between the replacement ID 324 and the refresh bank ID 424. If a conflict exists, the comparator 504 determines whether or not the refresh bank ID 424 can be postponed.

If the refresh bank ID 424 can be postponed and the conflict exists, the comparator 504 provides refresh feedback 444 to the refresh controller 404 to indicate that the refresh bank ID 424 should be changed. According to one embodiment, the refresh feedback 444 is only provided by the comparator 504 when the refresh bank ID 424 should be changed, and is not provided otherwise, but the present invention is not limited thereto. For example, the comparator 504 may provide the refresh feedback 444 at a first level if the refresh bank ID 424 should not be changed and at a second level if the refresh bank ID 424 should be changed.

If the refresh bank ID 424 can't be postponed and the conflict exists, the comparator 504 provides replacement feedback 344 to the replacement manager 304 to indicate that the replacement ID 324 should be changed. According to one embodiment, the replacement feedback 344 is only provided by the comparator 504 when the replacement ID 324 should be changed, and is not provided otherwise, but the present invention is not limited thereto. For example, the comparator 504 may provide the replacement feedback 344 at a first level if the replacement ID 324 should not be changed and at a second level if the replacement ID 324 should be changed.

When the refresh controller 404 receives the refresh feedback 444 indicating that the refresh bank ID 424 should not be changed (or the refresh controller 404 does not receive the refresh feedback 444), the refresh controller 404 outputs the refresh bank ID 424 as a final refresh bank ID 464.

When the refresh controller 404 receives the refresh feedback 444 indicating that the refresh bank ID 424 should be changed, the refresh controller 404 selects the next refresh bank ID based on the refresh policy and outputs the next refresh bank ID as the final refresh bank ID 464. The next refresh bank ID may be the next best refresh bank ID, the next oldest refresh bank ID, etc.

In other word, the refresh controller 404 selects the next refresh bank ID based on the refresh feedback 444 received from the comparator 504.

The bank that is postponed may be refreshed at the time that the next refresh bank would originally have been refreshed or may be delayed until its next regularly scheduled refresh. In other words, when the second refresh bank ID is selected, refreshing of the first refresh bank ID may be postponed until a time at which the second refresh bank ID would have been refreshed.

When the replacement manager 304 receives the replacement feedback 344 indicating that the replacement ID 324 should not be changed (or the replacement manager 304 does not receive the replacement feedback 344), the replacement manager 304 outputs the replacement ID 324 as a final replacement ID 364.

When the replacement manager 304 receives the replacement feedback 344 indicating that the replacement ID 324 should be changed, the replacement manager 304 selects the next replacement ID based on the replacement policy and outputs the next replacement ID as the final replacement ID 364. The next replacement ID may be the next best replacement ID, the next oldest replacement ID, etc.

In other word, the replacement manager 304 selects the new replacement ID based on the replacement feedback 344 received from the comparator 504.

Figure 8:
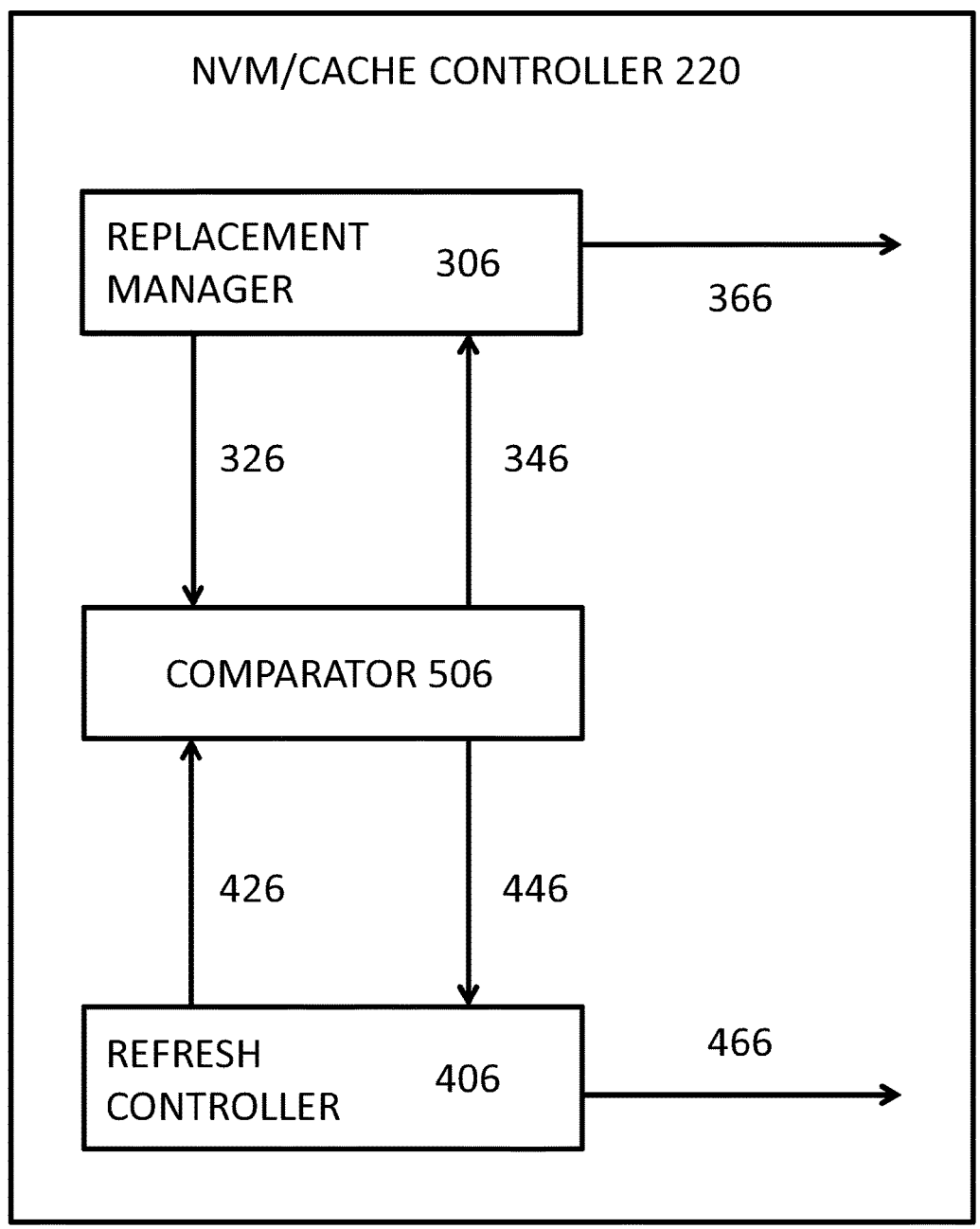
FIG. 8 is a block diagram of an NVM/Cache controller according to another embodiment of the present invention.

FIG. 8 is a block diagram of an NVM/Cache controller according to another embodiment of the present invention. Referring to FIG. 8, NVM/cache controller 220 (see FIG. 4) includes a replacement manager 306, a refresh controller 406, and a comparator 506. The NVM/cache controller 220 may manage a volatile memory cache. The volatile memory cache may be a Backside DRAM cache (for example, see the Backside DRAM cache 211a of FIG. 4). The volatile memory cache may include one or more memory banks and each of the memory banks may include a plurality of memory lines.

According to embodiments of the present invention, the replacement manager 306, the refresh controller 406, and the comparator 506 of the NVM/cache controller 220 may operate in a manner substantially similar to the replacement manager 300, the refresh controller 400, and the comparator 500 of FIG. 5, respectively. As such, a detailed description thereof may be omitted.

For example, the comparator 506 may receive the replacement ID 326 from the replacement manager 306 and may receive the refresh bank ID 426 from the refresh controller 406. The comparator may output the replacement feedback 346 based on whether or not a conflict exists. The replacement manager 306 may output the final replacement ID 366 and the refresh controller 406 may output the final refresh bank ID 466.

According to other embodiments of the present invention, the replacement manager 306, the refresh controller 406, and the comparator 506 of the NVM/cache controller 220 may operate in a manner substantially similar to the replacement manager 302, the refresh controller 402, and the comparator 502 of FIG. 6, respectively. As such, a detailed description thereof may be omitted.

For example, the comparator 506 may receive the replacement ID 326 from the replacement manager 306 and may receive the refresh bank ID 426 from the refresh controller 406. The comparator may output the refresh feedback 446 based on whether or not a conflict exists. The replacement manager 306 may output the final replacement ID 366 and the refresh controller 406 may output the final refresh bank ID 466.

According to still other embodiments of the present invention, the replacement manager 306, the refresh controller 406, and the comparator 506 of the NVM/cache controller 220 may operate in a manner substantially similar to the replacement manager 304, the refresh controller 404, and the comparator 504 of FIG. 7, respectively. As such, a detailed description thereof may be omitted.

For example, the comparator 506 may receive the replacement ID 326 from the replacement manager 306 and may receive the refresh bank ID 426 from the refresh controller 406. The comparator may output the refresh feedback 446 when a conflict exists and the refresh bank ID 426 can be changed. The comparator may output the replacement feedback 346 when a conflict exists and the refresh bank ID 426 can't be changed. The replacement manager 306 may output the final replacement ID 366 and the refresh controller 406 may output the final refresh bank ID 466.

Figure 9:
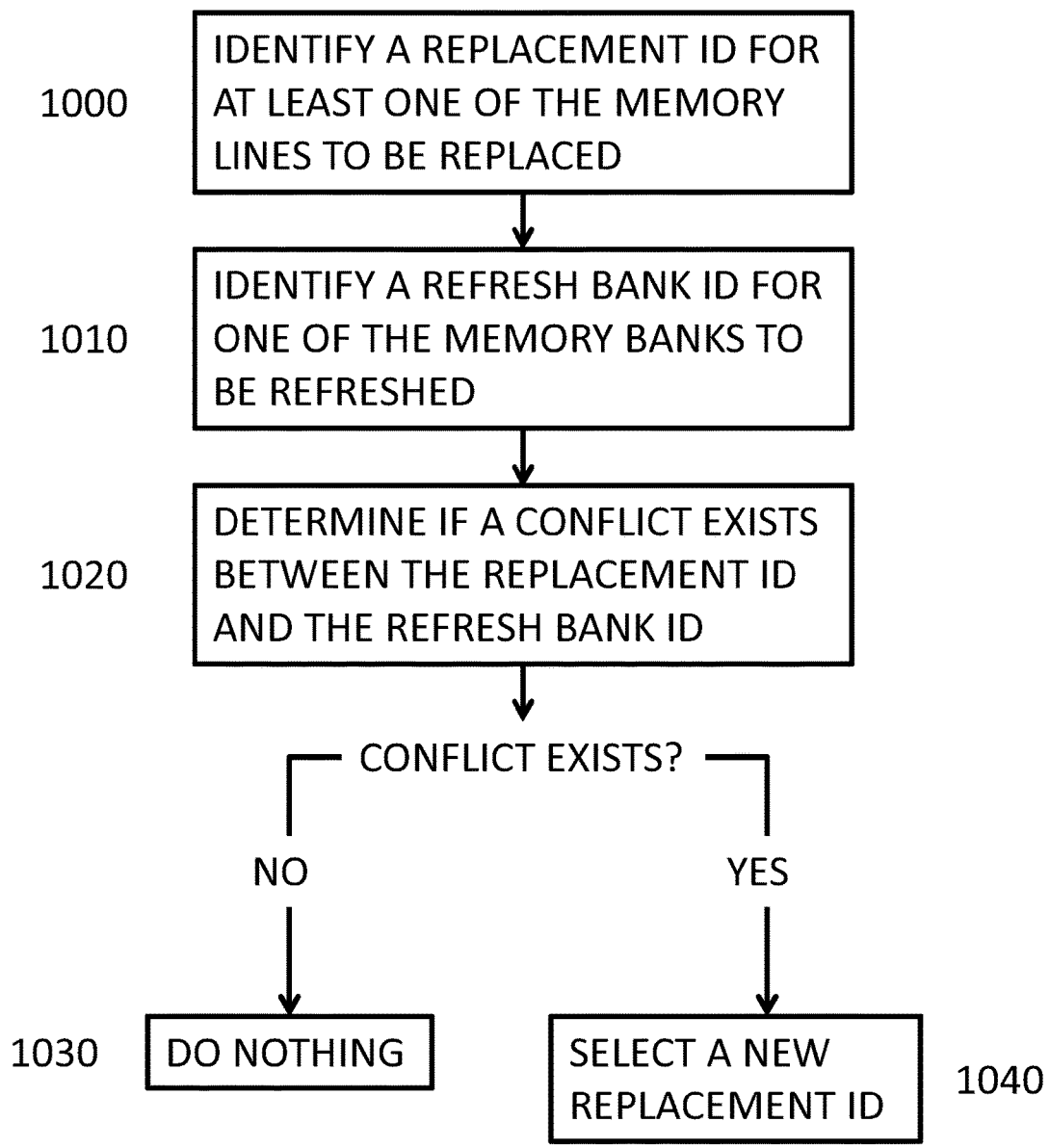
FIG. 9 is a flow chart illustrating a method of a replacement policy for volatile memory cache according to an embodiment of the present invention.

FIG. 9 is a flow chart illustrating a method of a replacement policy for a volatile memory cache according to an embodiment of the present invention. The volatile memory cache may include one or more memory banks. Each of the memory banks may include a plurality of memory lines. The volatile memory cache may be a Dynamic Random-Access Memory (DRAM) cache.

Referring to FIG. 9, according to one embodiment of the present invention, in operation 1000, a replacement ID for at least one of the memory lines to be replaced is identified. In operation 1010, a refresh bank ID for one of the memory banks to be refreshed is identified.

In operation 1020, it is determined whether or not a conflict exists between the replacement ID and the refresh bank ID. In operation 1030, when it is determined that a conflict does not exist, nothing is done to change the replacement ID or the refresh bank ID. In operation 1040, when it is determined that a conflict does exist, a new replacement ID is selected.

The method of FIG. 9 may be performed by a cache manager on a logic die. (See, for example, FIGS. 1-3 and 5-7.) Additionally, the method of FIG. 9 may be performed by an NVM/Cache Controller. (See, for example, FIGS. 4 and 8.)

Figure 10:
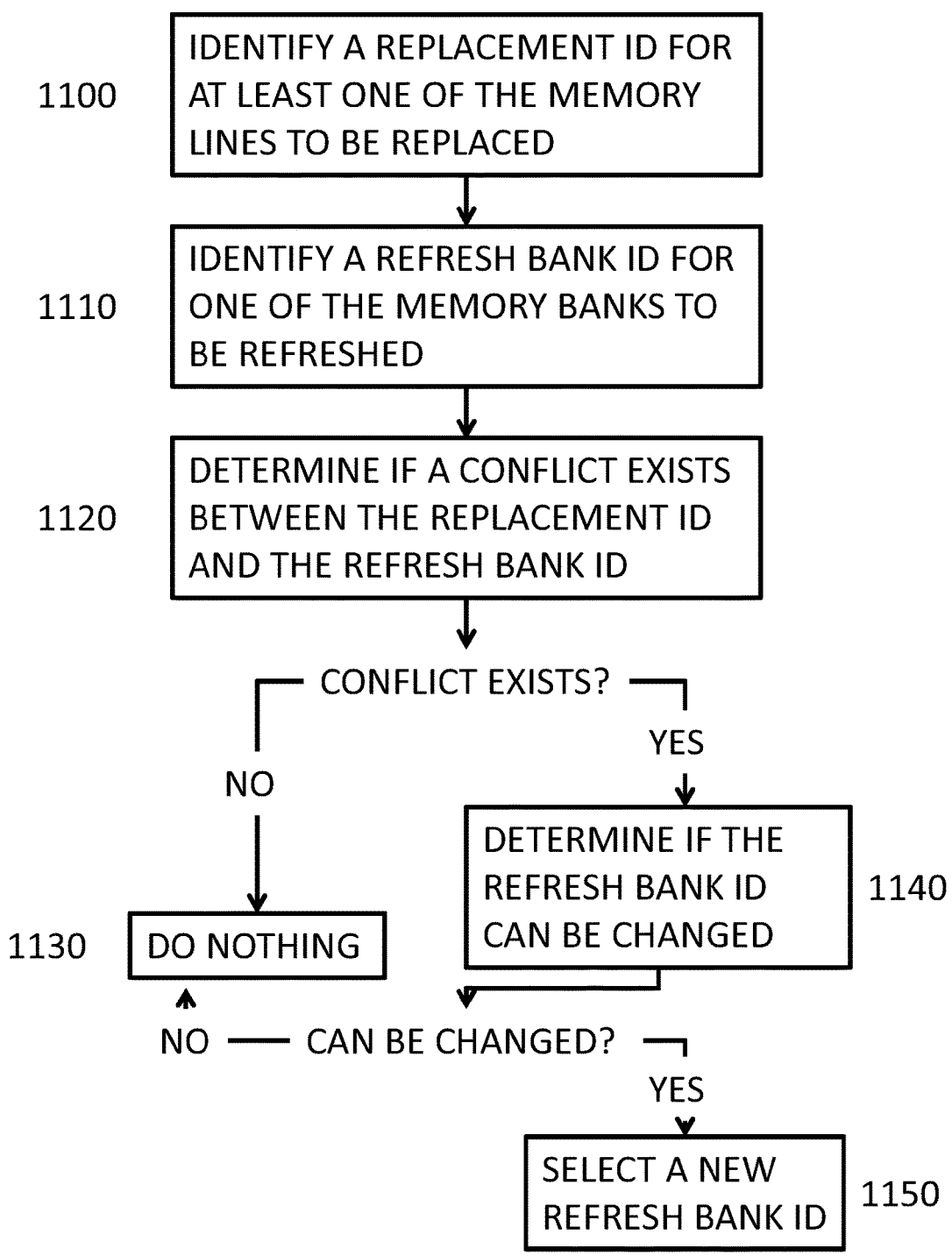
FIG. 10 is a flow chart illustrating another method of a replacement policy for volatile memory cache according to an embodiment of the present invention.

FIG. 10 is a flow chart illustrating another method of a replacement policy for a volatile memory cache according to an embodiment of the present invention. The volatile memory cache may include one or more memory banks. Each of the memory banks may include a plurality of memory lines. The volatile memory cache may be a Dynamic Random-Access Memory (DRAM) cache.

Referring to FIG. 10, according to one embodiment of the present invention, in operation 1100, a replacement ID for at least one of the memory lines to be replaced is identified. In operation 1110, a refresh bank ID (for example, a first refresh bank ID) for one of the memory banks to be refreshed is identified.

In operation 1120, it is determined whether or not a conflict exists between the replacement ID and the refresh bank ID. In operation 1130, when it is determined that a conflict does not exist, nothing is done to change the replacement ID or the refresh bank ID. In operation 1140, when it is determined that a conflict does exist, it is determined whether or not the refresh bank ID can be changed. Further, in operation 1130, when it is determined that a conflict does exist and that the refresh bank ID can't be changed, nothing is done to change the replacement ID or the refresh bank ID. In operation 1150, when it is determined that a conflict does exist and that the refresh bank ID can be changed, a new refresh bank ID (for example, a second refresh bank ID) is selected.

The method of FIG. 10 may be performed by a cache manager on a logic die. (See, for example, FIGS. 1-3 and 5-7.) Additionally, the method of FIG. 9 may be performed by an NVM/Cache Controller. (See, for example, FIGS. 4 and 8.)

Figure 11:
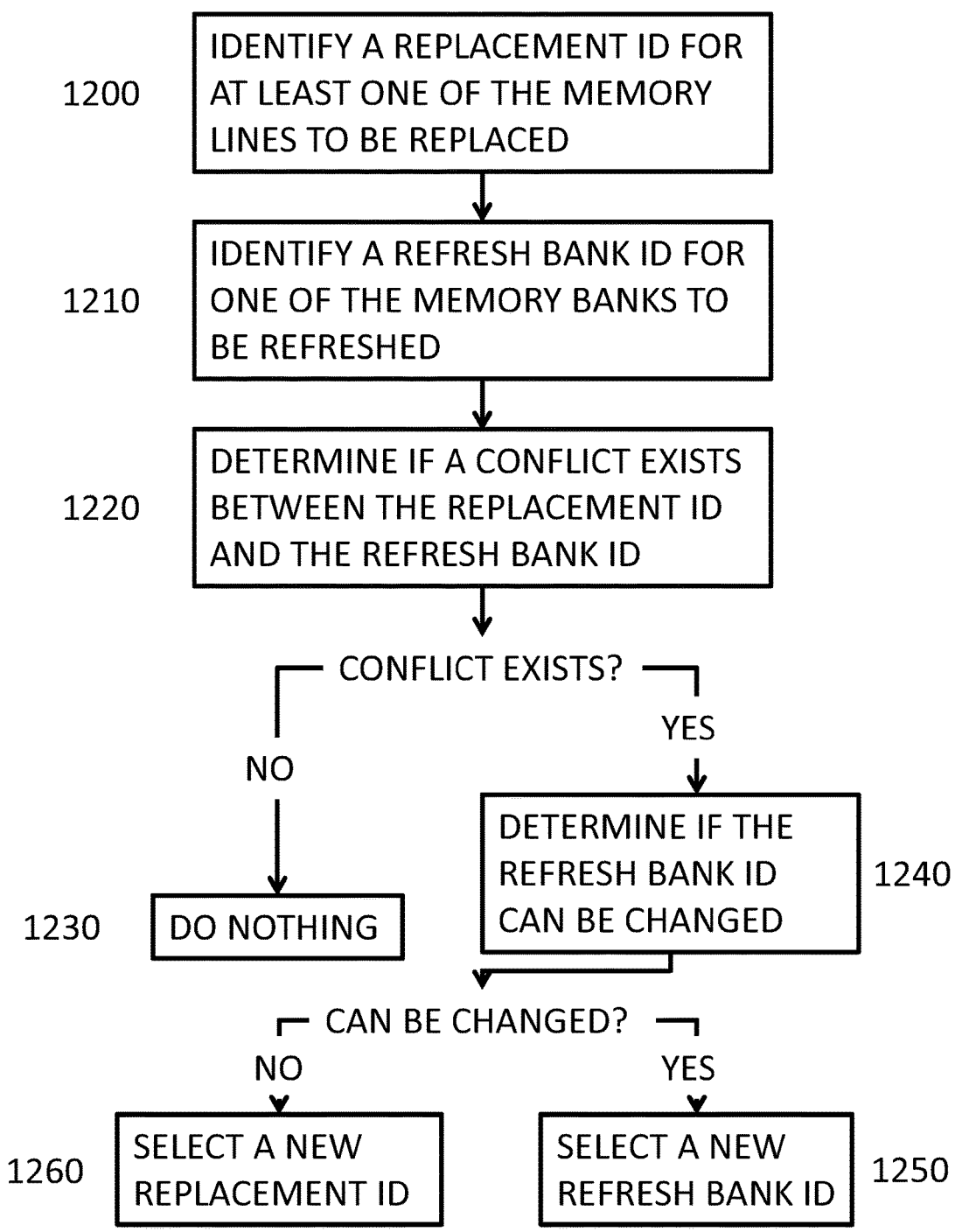
FIG. 11 is a flow chart illustrating another method of a replacement policy for volatile memory cache according to an embodiment of the present invention.

FIG. 11 is a flow chart illustrating another method of a replacement policy for a volatile memory cache according to an embodiment of the present invention. The volatile memory cache may include one or more memory banks. Each of the memory banks may include a plurality of memory lines. The volatile memory cache may be a Dynamic Random-Access Memory (DRAM) cache.

Referring to FIG. 11, according to one embodiment of the present invention, in operation 1200, a replacement ID for at least one of the memory lines to be replaced is identified. In operation 1210, a refresh bank ID for one of the memory banks to be refreshed is identified.

In operation 1220, it is determined whether or not a conflict exists between the replacement ID and the refresh bank ID. In operation 1230, when it is determined that a conflict does not exist, nothing is done to change the replacement ID or the refresh bank ID. In operation 1240, when it is determined that a conflict does exist, it is determined whether or not the refresh bank ID can be changed. In operation 1250, when it is determined that a conflict does exist and that the refresh bank ID can be changed, a new refresh bank ID is selected. In operation 1260, when it is determined that a conflict does exist and that the refresh bank ID can't be changed, a new replacement ID is selected.

The method of FIG. 11 may be performed by a cache manager on a logic die. (See, for example, FIGS. 1-3 and 5-7.) Additionally, the method of FIG. 9 may be performed by an NVM/Cache Controller. (See, for example, FIGS. 4 and 8.)

As such, according to embodiments of the present invention, when a conflict exists between a replacement ID and a refresh bank ID, either the replacement ID or the refresh bank ID may be changed in order to avoid delays. More particularly, some embodiments of the present invention may identify a replacement ID and a refresh bank ID and when there is a conflict, embodiments of the present invention may select a new replacement ID in order to avoid delays caused by the conflict. Additionally, some embodiments of the present invention may identify a replacement ID and a refresh bank ID and when there is a conflict, embodiments of the present invention may check if the refresh bank ID can be changed and, if the refresh bank ID can be changed, select a new refresh bank ID in order to avoid delays caused by the conflict.

It will be understood that, although the terms "first," "second," "third," etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the spirit and scope of the present invention.

A relevant device or component (or relevant devices or components) according to embodiments of the present invention described herein may be implemented utilizing any suitable hardware (e.g., an application-specific integrated circuit), firmware (e.g., a DSP or FPGA), software, or a suitable combination of software, firmware, and hardware. For example, the various components of the relevant device(s) may be formed on one integrated circuit (IC) chip or on separate IC chips. Further, the various components of the relevant device(s) may be implemented on a flexible printed circuit film, a tape carrier package (TCP), a printed circuit board (PCB), or formed on a same substrate as one or more circuits and/or other devices. Further, the various components of the relevant device(s) may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Spatially relative terms, such as "top," "bottom," "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it will also be understood that when one element, component, region, layer, and/or section is referred to as being "between" two elements, components, regions, layers, and/or sections, it can be the only element, component, region, layer, and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Furthermore, "connection," "connected," etc., may also refer to "electrical connection," "electrically connected," etc., depending on the context in which such terms are used as would be understood by those skilled in the art. When an element or layer is referred to as being "directly on," "directly connected to," "directly coupled to," "directly connected with," "directly coupled with," or "immediately adjacent to" another element or layer, there are no intervening elements or layers present.

As used herein, "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Features described in relation to one or more embodiments of the present invention are available for use in conjunction with features of other embodiments of the present invention. For example, features described in a first embodiment may be combined with features described in a second embodiment to form a third embodiment, even though the third embodiment may not be specifically described herein.

A person of skill in the art should also recognize that the process may be executed via hardware, firmware (e.g. via an ASIC), or in any combination of software, firmware, and/or hardware. Furthermore, the sequence of steps of the process is not fixed, but can be altered into any desired sequence as recognized by a person of skill in the art. The altered sequence may include all of the steps or a portion of the steps.

Although this invention has been described with regard to certain specific embodiments, those skilled in the art will have no difficulty devising variations of the described embodiments, which in no way depart from the scope and spirit of the present invention. Furthermore, to those skilled in the various arts, the invention itself described herein will suggest solutions to other tasks and adaptations for other applications. It is the Applicant's intention to cover by claims all such uses of the invention and those changes and modifications which could be made to the embodiments of the invention herein chosen for the purpose of disclosure without departing from the spirit and scope of the invention. Thus, the present embodiments of the invention should be considered in all respects as illustrative and not restrictive, the scope of the invention to be indicated by the appended claims and their equivalents.

What is claimed is:

1. A method of evicting data on a volatile memory cache, the volatile memory cache comprising one or more memory banks, each of the memory banks comprising a plurality of memory lines, the method comprising:
    identifying a replacement ID for at least one of the memory lines to be evicted;
    identifying a refresh bank ID for one of the memory banks to be refreshed;
    determining whether or not a conflict exists between the replacement ID and the refresh bank ID; and
    selecting a new replacement ID in response to determining the conflict exists; and
    evicting at least a portion of at least one memory line of the plurality of memory lines associated with the new replacement ID.

2. The method of claim 1, wherein the volatile memory cache comprises a Dynamic Random-Access Memory (DRAM) cache.

3. The method of claim 1, wherein the method is performed by a cache manager of the volatile memory cache.

4. The method of claim 3, wherein the cache manager comprises:
    a replacement manager to identify the replacement ID;
    a refresh controller to identify the refresh bank ID; and
    a comparator to determine whether or not the conflict exists.

5. The method of claim 4, wherein the replacement manager further selects the new replacement ID based on replacement feedback received from the comparator.

6. A method of evicting data on a volatile memory cache, the volatile memory cache comprising one or more memory banks, each of the memory banks comprising a plurality of memory lines, the method comprising:
    identifying a replacement ID for at least one of the memory lines to be evicted;
    identifying a first refresh bank ID for one of the memory banks to be refreshed;
    determining whether or not a conflict exists between the replacement ID and the first refresh bank ID;
    in response to determining the conflict exists, determining whether or not the first refresh bank ID can be changed;
    in response to determining the conflict exists and the first refresh bank ID can be changed, selecting a second refresh bank ID; and
    refreshing a memory bank of the one or more memory banks associated with the second refresh bank ID.

7. The method of claim 6, wherein the volatile memory cache comprises a Dynamic Random-Access Memory (DRAM) cache.

8. The method of claim 6, wherein the method is performed by a cache manager of the volatile memory cache.

9. The method of claim 8, wherein the cache manager comprises:
    a replacement manager to identify the replacement ID;
    a refresh controller to identify the first refresh bank ID; and
    a comparator to determine whether or not the conflict exists.

10. The method of claim 9, wherein the refresh controller further selects the second refresh bank ID based on refresh feedback received from the comparator.

11. The method of claim 6, further comprising, if the conflict exists and the first refresh bank ID cannot be changed, selecting a new replacement ID.

12. The method of claim 11, wherein the method is performed by a cache manager of the volatile memory cache, and
    wherein the cache manager comprises:
    a replacement manager to identify the replacement ID;
    a refresh controller to identify the first refresh bank ID; and
    a comparator to determine whether or not the conflict exists.

13. The method of claim 6, wherein when the second refresh bank ID is selected, refreshing of the first refresh bank ID is postponed until the next regularly scheduled refresh of the first refresh bank ID.

14. The method of claim 6, wherein when the second refresh bank ID is selected, refreshing of the first refresh bank ID is postponed until a time at which the second refresh bank ID would have been refreshed.

15. A cache manager for managing a cache comprising a volatile memory cache, the volatile memory cache comprising one or more memory banks, each of the memory banks comprising a plurality of memory lines, the cache manager comprising:
   a replacement manager to identify a replacement ID for at least one of the memory lines to be evicted;
   a refresh controller to identify a refresh bank ID for one of the memory banks to be refreshed; and
   a comparator to determine whether or not a conflict exists between the replacement ID and the refresh bank ID and, in response to determining the conflict exists, to send either replacement feedback to the replacement manager or refresh feedback to the refresh controller, the replacement feedback to cause the replacement manager to select a new replacement ID and the refresh feedback to cause the refresh controller to select a new refresh bank ID, wherein at least of one of:
      the replacement manager outputs the replacement ID evicting at least a portion of at least one memory line of the plurality of memory lines associated with the new replacement ID; or
      the refresh controller outputs the new refresh bank ID refreshing a memory bank of the one or more memory banks associated with the new refresh bank ID.

16. The cache manager of claim 15, wherein the volatile memory cache comprises a Dynamic Random-Access Memory (DRAM) cache.

17. The cache manager of claim 15, wherein the comparator is further configured to send the replacement feedback to the replacement manager.

18. The cache manager of claim 15, wherein the comparator is further configured to send the refresh feedback to the refresh controller.

19. The cache manager of claim 15, wherein the comparator is further configured to:
   if the conflict exists, determine whether or not the refresh bank ID can be changed;
   if the refresh bank ID can be changed, send the refresh feedback to the refresh controller; and
   if the refresh bank ID cannot be changed, send the replacement feedback to the replacement manager.

20. The cache manager of claim 15, wherein the cache further comprises non-volatile memory.

* * * * *